United States Patent [19]

Tanizawa et al.

[11] Patent Number: 5,388,055
[45] Date of Patent: Feb. 7, 1995

[54] SEMICONDUCTOR INTEGRATED CIRCUIT HAVING POLYCELL STRUCTURE AND METHOD OF DESIGNING THE SAME

[75] Inventors: Tetsu Tanizawa; Hideo Tokuda; Shigenori Ichinose; Katuzi Hirochi, all of Kawasaki; Takehito Doi, Kasugai, all of Japan

[73] Assignee: Fujitsu Limited, Kawasaki, Japan

[21] Appl. No.: 756,017

[22] Filed: Sep. 6, 1991

[30] Foreign Application Priority Data

Sep. 7, 1990 [JP] Japan .................. 2-237721

[51] Int. Cl.⁶ ........................................... H01L 23/48
[52] U.S. Cl. ................................... 364/491; 364/488; 364/489
[58] Field of Search ............... 364/488, 489, 490, 491; 357/68; 307/465.1

[56] References Cited

U.S. PATENT DOCUMENTS

| | | | |
|---|---|---|---|
| 4,716,452 | 12/1987 | Kondoh et al. | 357/68 |
| 4,883,980 | 11/1989 | Morimoto et al. | 307/465.1 |
| 4,922,432 | 5/1990 | Kobayashi et al. | 364/489 |
| 4,972,324 | 11/1990 | Tanaka | 364/491 |

*Primary Examiner*—Kevin J. Teska
*Assistant Examiner*—Stephen J. Walder, Jr.
*Attorney, Agent, or Firm*—Staas & Halsey

[57] ABSTRACT

A semiconductor integrated circuit includes a substrate which has a predetermined width in a first direction and a predetermined length in a second direction which is approximately perpendicular to the first direction, a plurality of cells which are provided on the substrate and are grouped into a plurality of generally rectangular unit blocks, where each of the unit blocks are made up of cells having mutually different widths in the first direction but a common length in the second direction, first interconnections for supplying at least one power source voltage to the cells, where the first interconnections are provided independently for each unit block so as to supply the power source voltage in common to each of the cells making up the unit block, a row of first terminals of the cells, within each unit block, arranged in the first direction, a row of second terminals of the cells, within each unit block, arranged in the first direction an interconnection region at least including a region which is defined by the rows of the first and second terminals, and second interconnections which are provided within the interconnection region with respect to each unit block and connects the cells within the unit block.

17 Claims, 11 Drawing Sheets

SEMICONDUCTOR INTEGRATED CIRCUIT HAVING POLYCELL STRUCTURE AND METHOD OF DESIGNING THE SAME

BACKGROUND OF THE INVENTION

The present invention generally relates to a semiconductor integrated circuit and method of designing the same, and more particularly, to a semiconductor integrated circuit having a polycell structure suited for an emitter coupled logic (ECL) or current mode logic (CML) large scaled integrated circuit (LSI) and to a method of designing such a semiconductor integrated circuit.

Recently, there are demands to produce LSI, using computer aided design (CAD), which operate at a high speed and have a large power consumption, such as ECL, CML and bipolar complementary metal oxide semiconductor (BiCMOS) devices.

For this reason, there is a need to realize a technique for enabling a CAD layout which is both flexible and capable of providing a sufficiently large power supplying capacity.

A unit block and an integrated circuit having a hierarchical structure based on unit blocks were previously proposed in U.S. patent application Ser. No. 492,898 filed Mar. 13, 1990, in which the assignees are the same as the assignees of this application.

The unit block is a hierarchical structure unit in which a plurality of cells having a common height and mutually different widths are arranged in a specific direction taken along the width of the cells. The unit blocks have a standardized width. Each cell forming the unit block has a power consumption which is approximately proportional to the dimension of the cell in the specific direction. For this reason, the unit blocks themselves have a standardized power consumption because the unit blocks have the standardized width. By arranging such unit blocks on a chip, it becomes possible to freely design an arithmetic logic unit (ALU) and the like using bipolar transistors which operate at a high speed.

FIG. 1 shows a typical example of a unit block in a plan view. A unit block 10 includes a plurality of cells 10a respectively having widths Wc, Wc', . . . , and the cells 10a are arranged so that the unit block 10 as a whole has a width L along the X direction. First and second interconnections 10b and 10c, for supplying power, are respectively formed on the top and bottom of the cells 10a, and the unit block 10 as a whole has a height H along the Y direction.

As described above, the unit block 10 has the standardized width L. A plurality of such unit blocks 10 are arranged on a substrate SUB of a semiconductor integrated circuit (chip) as shown in FIG. 2, and macro block 100 which functions as an ALU, for example, is formed on the chip by forming interconnections for connecting the cells 10a of the unit blocks 10 in a predetermined manner. In this case, it is possible to stably supply a sufficient amount of current from a power source to each unit block 10 within the macro block 100 regardless of the arrangement of the unit blocks 10, using a fixed power source system which extends regularly in the Y direction in FIG. 2. Hence, an integrated circuit which is formed using the unit block concept shown in FIG. 2 is particularly suited for a bipolar high-speed operation element such as the ECL, CML and BiCMOS. On the other hand, interconnections among the macro blocks 100 can freely be made using a global channel 101, that is, a gap between the macro blocks 100. Therefore, the integrated circuit having this structure is suited for design by the CAD.

FIG. 3 shows an example of the cell 10a which is used to form the unit block 10. FIG. 3 shows a case where an independent power source voltage $V_T$ is used in addition to power source voltages $V_{CC}$ and $V_{EE}$. An interconnection 10b extends in the X direction at an upper part of the unit block 10 in the Y direction. On the other hand, interconnections 10c1 and 10c2 respectively extend in the X direction at a lower part of the unit block 10 in the Y direction. The interconnections 10b, 10c1 and 10c2 are parallel to each other.

As shown in FIG. 3, a plurality of terminal regions are provided within the cell 10a in correspondence with emitters, collectors and bases of transistors Tr1 through Tr5. However, these terminal regions are provided without considering a specific relationship to the height of the cell 10a, that is, the Y direction. For this reason, when connecting a plurality of cells 10a within the unit block 10 using interconnections, it is necessary to generate a complex interconnection pattern which avoids the terminal regions which should not connect to the interconnections. As a result, there is a problem in that the design of the interconnections using the CAD becomes troublesome and time consuming.

On the other hand, a voltage drop of some sort occurs in the power source voltage within the complex interconnections which are formed on the semiconductor chip for supplying power. However, since the extent of the voltage drop differs depending on the part of the chip, the output levels of transistors which form the integrated circuit differ between the central part and the peripheral part of the chip, for example. As a result, there are problems in that the D.C. margin becomes poor and the propagation delay deviates from the normal value.

Conventionally, the compensation of the voltage drop of the power source voltage is made by making a model of the power source system for the entire chip, and inserting an adjusting resistor at various parts within the chip based on a simulation result of the voltage drop. The resistance of the adjusting resistor is set by controlling the amount of impurities injected into a diffusion region which forms the adjusting resistor based on the estimated voltage drop. However, there is a problem in that such an adjustment is troublesome to carry out. In addition, the calculation of the voltage drop is complex, particularly in the case of a standard cell LSI having a complex power source layout, because a model of such a standard cell LSI is difficult to design using the CAD.

SUMMARY OF THE INVENTION

Accordingly, it is a general object of the present invention to provide a novel and useful semiconductor integrated circuit and method of designing the same, in which the problems described above are eliminated.

Another and more specific object of the present invention is to provide a semiconductor integrated circuit comprising a substrate which has a predetermined width in a first direction and a predetermined length in a second direction which is approximately perpendicular to the first direction, a plurality of cells which are provided on the substrate, where the cells are grouped into a plurality of generally rectangular unit blocks and each of the unit blocks are made up of cells having mutually different widths in the first direction but a common length in the second direction, first interconnections for supplying at least one power source voltage to the cells, where the first interconnections are provided independently for each unit block so as to supply the power source voltage in common to each of the cells making up the unit block, a row of first terminals of the cells, within each unit block, arranged in the first direction, a row of second terminals of the cells, within each unit block, arranged in the first direction, an interconnection region at least including a region which is defined by the rows of the first and second terminals, and second interconnections which are provided within the interconnection region with respect to each unit block and connects the cells within the unit block. According to the semiconductor integrated circuit of the present invention, it is possible to realize a high-performance chip which enables stable operation and has a uniform clock skew and the like.

Still another object of the present invention is to provide a semiconductor integrated circuit of the type described above, wherein a plurality of resistor regions are formed in each unit block and connected to the first interconnections via contact holes for supplying a driving current to the cells within the unit block, and the position of each contact hole is set so that a predetermined voltage is supplied to a corresponding one of the cells. According to the semiconductor integrated circuit of the present invention, the positions of the contact holes may be offset in the second direction depending on an amount of voltage drop to be compensated at each position, thereby facilitating the voltage drop compensation.

A further object of the present invention is to provide a computer-implemented method of designing a semiconductor integrated circuit which comprises a substrate having a predetermined width in a first direction and a predetermined length in a second direction which is approximately perpendicular to the first direction, a plurality of cells which are provided on the substrate and are grouped into a plurality of generally rectangular unit blocks, where each of the unit blocks are made up of cells having mutually different widths in the first direction but a common length in the second direction, first interconnections for supplying at least one power source voltage to the cells, where the first interconnections are provided independently for each unit block so as to supply the power source voltage in common to each of the cells making up the unit block, a row of first terminals of the cells, within each unit block, arranged in the first direction, a row of second terminals of the cells, within each unit block, arranged in the first direction, an interconnection region at least including a region which is defined by the rows of the first and second terminals, and second interconnections which are provided within the interconnection region with respect to each unit block and connects the cells within the unit block. The computer-implemented method comprises the steps of (a) forming a hierarchical logic circuit diagram, (b) determining a general layout of the entire semiconductor integrated circuit, (c) determining an arrangement of elements and interconnections for each hierarchical block of the hierarchical logic circuit, (d) determining a detailed layout of the entire semiconductor integrated circuit, and (e) forming masks in accordance with the detailed layout, where the step (c) determines, for each hierarchical block, at least a combination of the unit blocks and arranges a row of third terminals of the cells within each unit block in the first direction outside the interconnection region, and the third terminals are used for transferring a signal selected from a group consisting of a clock signal, a reset signal, a selector input signal, an ON/OFF signal for controlling a power save mode of the semiconductor integrated circuit, a tri-state control signal, a bus control signal and a test signal. According to the computer-implemented method of the present invention, it is possible to efficiently arrange the interconnections using the CAD.

Other objects and further features of the present invention will be apparent from the following detailed description when read in conjunction with the accompanying drawings.

DESCRIPTION OF THE PREFERRED EMBODIMENTS

Figure 4:
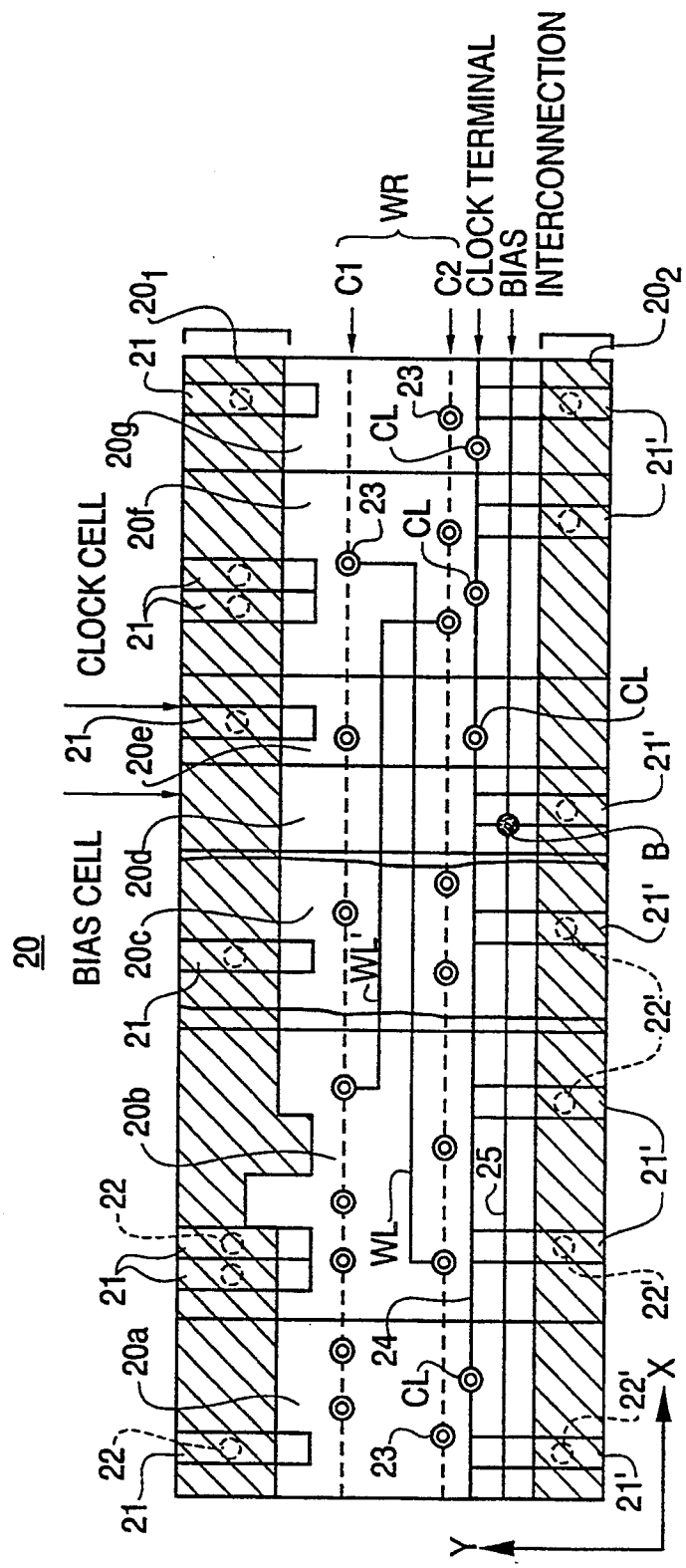
FIG. 4 is a plan view showing a unit block of a first embodiment of a semiconductor integrated circuit according to the present invention.

A description will be given of a first embodiment of a semiconductor integrated circuit according to the present invention, by referring to FIG. 4. FIG. 4 shows a unit block structure.

Figure 1:
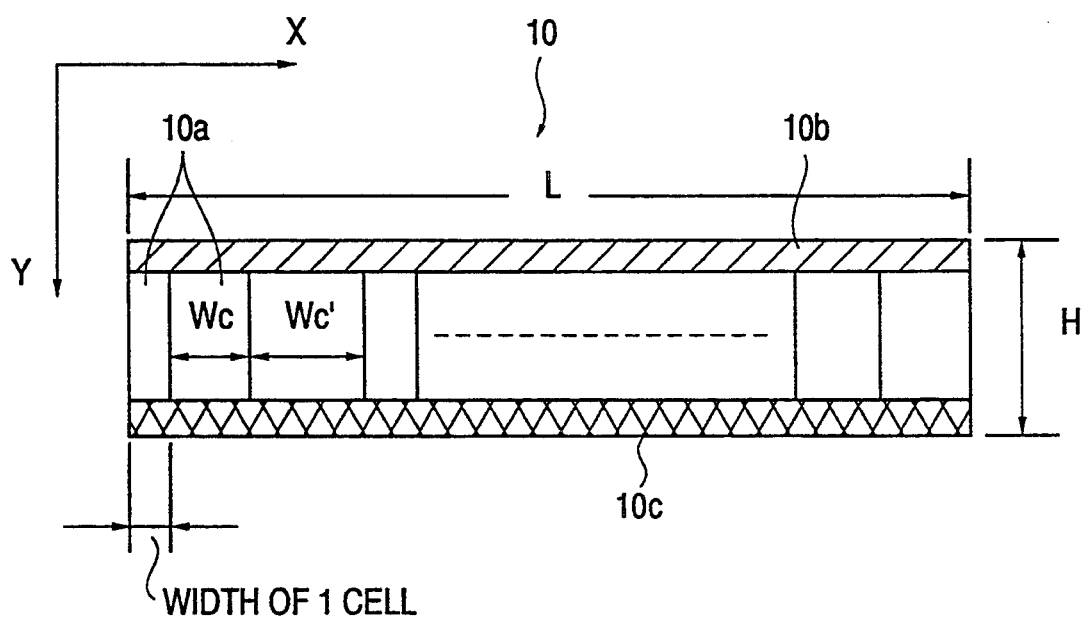
FIG. 1 is a plan view showing an example of a previously proposed unit block.
Figure 2:
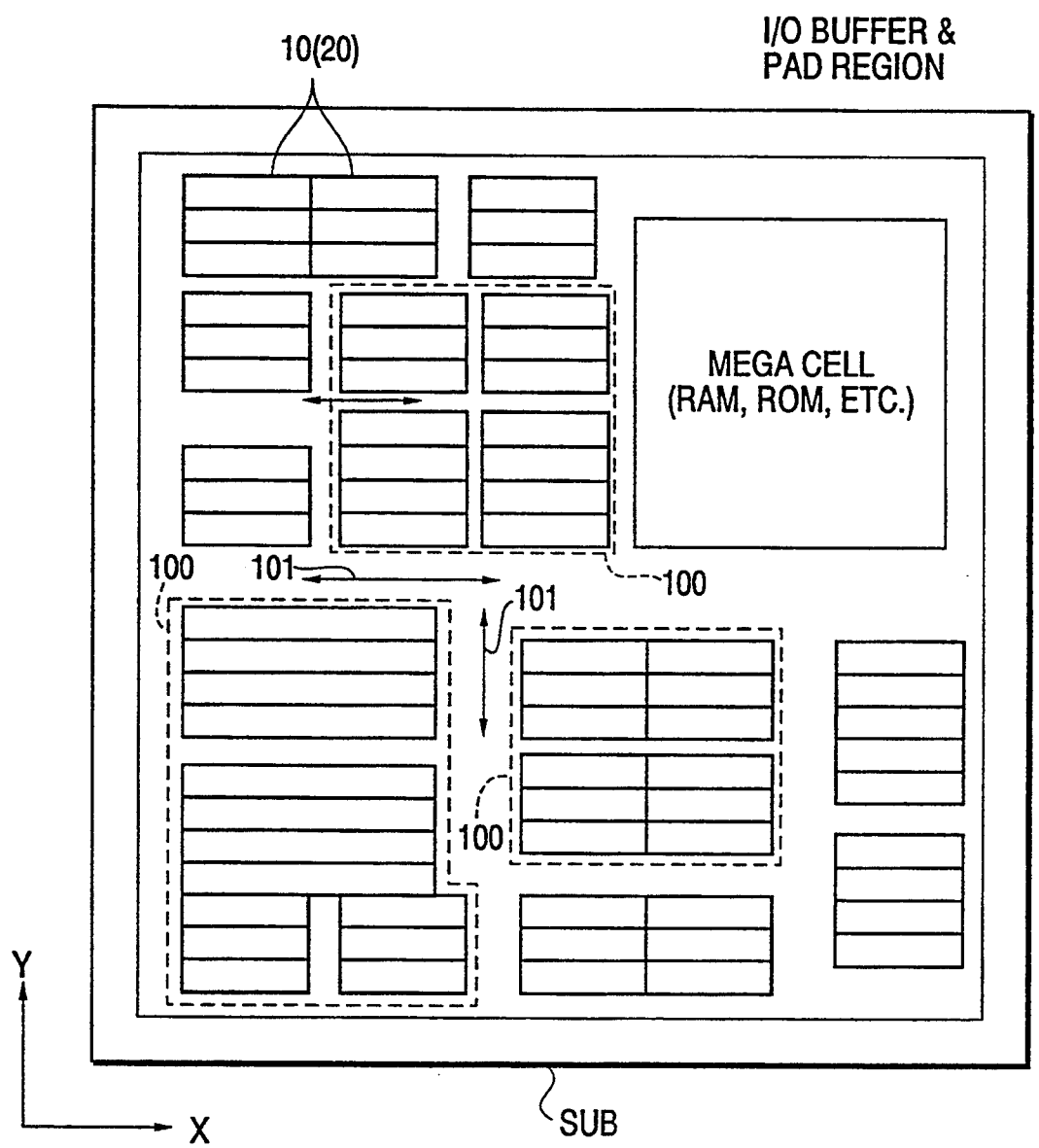
FIG. 2 is a plan view showing an example of a layout of a previously proposed integrated circuit (chip)
Figure 3:
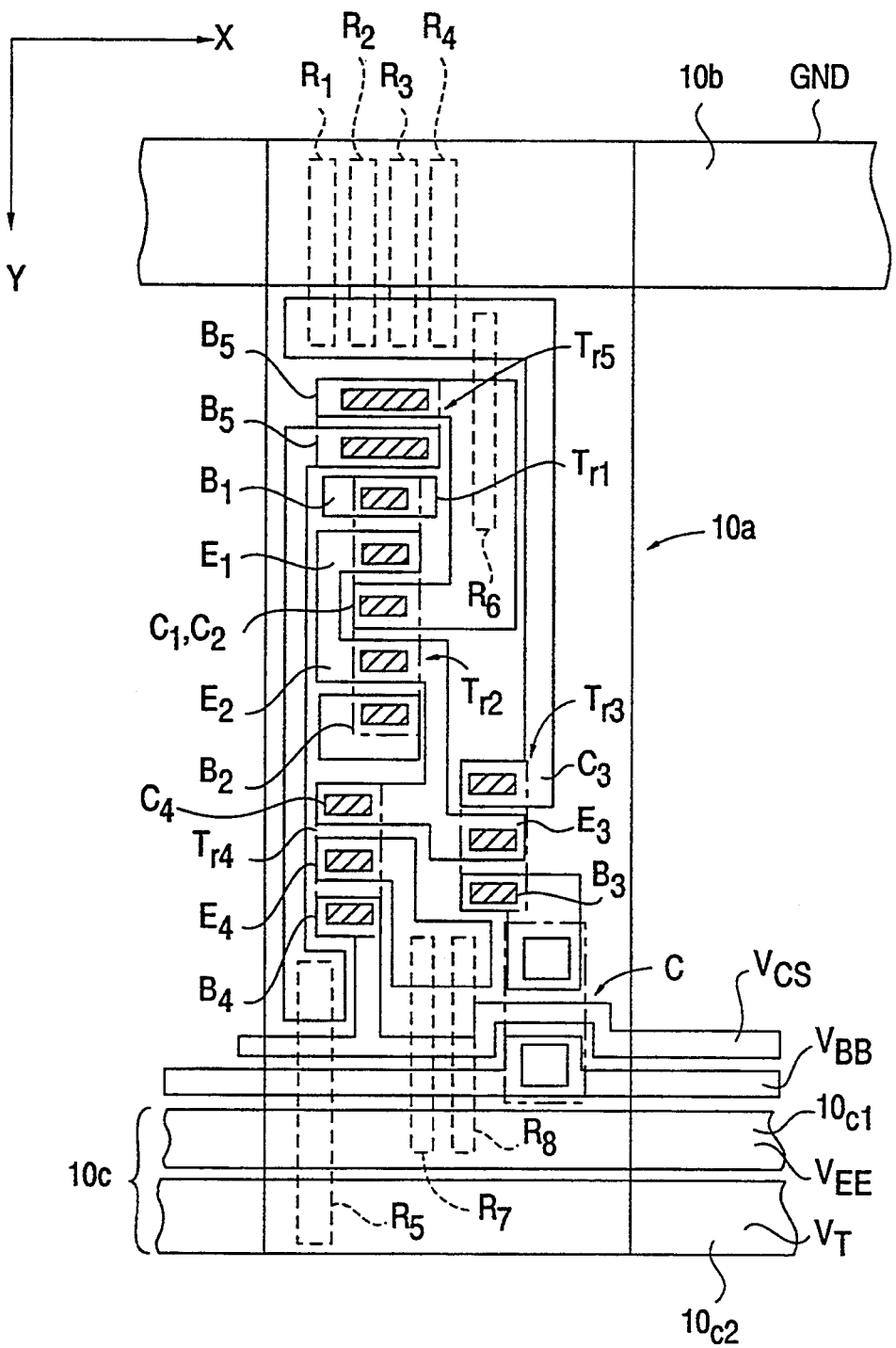
FIG. 3 is a plan view showing an example of a previously proposed polycell structure.

A unit block 20 shown in FIG. 4 is used in place of the previously proposed unit block 10 in the semiconductor integrated circuit shown in FIG. 2. The arrangement of the unit block within the semiconductor integrated circuit (chip) is further disclosed in U.S. patent application Ser. No. 492,898 filed Mar. 13, 1990, the disclosure of which is hereby incorporated by reference.

The unit block 20 has a uniform height in the Y direction, and includes cells $20a$, $20b$, $20c$, $20d$, $20e$, $20f$, $20g$, ... having mutually different widths in the X direction. A first interconnection $20_1$ extends in the X direction at the upper part of the unit block 20 along the Y direction. A second interconnection $20_2$ extends in the X direction at the lower part of the unit block 20 along the Y direction. The first and second interconnections $20_1$ and $20_2$ are provided in common to each of the cells 20a, 20b, 20c, 20d, 20e, 20f, 20g, . . .

The first and second interconnections $20_1$ and $20_2$ are connected to a fixed power source system (not shown) which is provided along a global channel 101 between two mutually adjacent macro blocks 100 shown in FIG. 2, and distribute the power source voltage which is received from the fixed power source system to the cells 20a, 20b, 20c, 20d, 20e, 20f, 20g, . . . . The power source voltage which is supplied to each cell is supplied to circuit elements within the cell via a diffusion region 21 (or 21'). This diffusion region 21 (or 21') is coupled to the interconnection $20_1$ (or $20_2$) via a contact hole 22 (or 22') and acts as a resistor.

In FIG. 2, interconnections for supplying the power source voltage from the fixed power source system are provided independently for each unit block 20 on the substrate SUB, or independently for each macro block 100 which is made up of a plurality of unit blocks 20.

The circuit elements within each cell form a logic circuit such as an AND circuit, a NAND circuit, an OR circuit, a NOR circuit and a latch circuit. Hence, each cell has a plurality of input/output terminals 23. In this embodiment, however, the input/output terminals of the cells which form the unit block 20 are arranged at predetermined height positions along the Y direction and form terminal rows C1 and C2. An interconnection region (or wiring region) WR is formed to include at least a specific region (indicated by dotted lines) defined by the terminal rows C1 and C2, and interconnection patterns WL and WL' are formed on the unit block 20 in the interconnection region WR to connect the terminals 23. Preferably, the height of the interconnection region WR is slightly greater than that of the specific region defined by the terminal rows C1 and C2 because the interconnection patterns may project outside this specific region when the necessary margin and the like is considered to ensure a positive contact. The specific region has a height such that two to three transistors can be formed in the Y direction.

The interconnection region WR extends linearly in the direction X within the unit block 20 from one end to the other. For this reason, it is possible to realize the interconnections for connecting the terminals 23 by conductor patterns which extend linearly in the X and Y directions. Of course, the conductor pattern which extends in the X direction and the conductor pattern which extends in the Y direction are formed on different levels which are isolated by an insulator layer (not shown), and the necessary contact may be realized via a contact hole which is formed in the insulator layer. Such linear conductor patterns are easily generated using the CAD. Furthermore, since the terminals 23 of the cells do not exist at random within the interconnection region WR but are arranged linearly, there are very few obstacles to the interconnections and the interconnections can be designed with a large degree of freedom using the CAD.

On the other hand, common buses which are used to supply a clock signal, a bias voltage and the like to each of the cells 20a, 20b, 20c, 20d, 20e, 20f, 20g, . . . also extend in the X direction within the unit block 20, in addition to the interconnections $20_1$ and $20_2$. In other words, a bias bus 25 extends in the X direction within the unit block 20 from one end to the other, so as to supply a bias voltage to each cell within the unit block 20. In addition, a clock bus 24 extends in the X direction within the unit block 20 from one end to the other, so as to supply a clock signal to each cell within the unit block 20.

In this embodiment, clock terminals CL of the cells 20a, 20e, 20f, 20g, . . . are arranged in the X direction, and the clock bus 24 runs along the row of clock terminals CL. For example, the clock signal is generated in the cell 20e and is supplied to the other cells 20a, 20f, 20g, . . . within the unit block 20. The cell 20d, for example, is used as a bias cell. The cell 20d receives a bias voltage from a bias bus (not shown) which extends in the Y direction via a contact hole B, and distributes the bias voltage to each cell within the unit block 20. Although not shown in FIG. 4, bias voltage terminals of the cells 20a, 20e, 20f, 20g, . . . are arranged in the X direction, and the bias bus 25 runs along the row of bias voltage terminals.

In order to positively pass the bias bus 25 and the clock bus 24, a reserve channel may be provided at a predetermined height position of the unit block 20.

Figure 5:
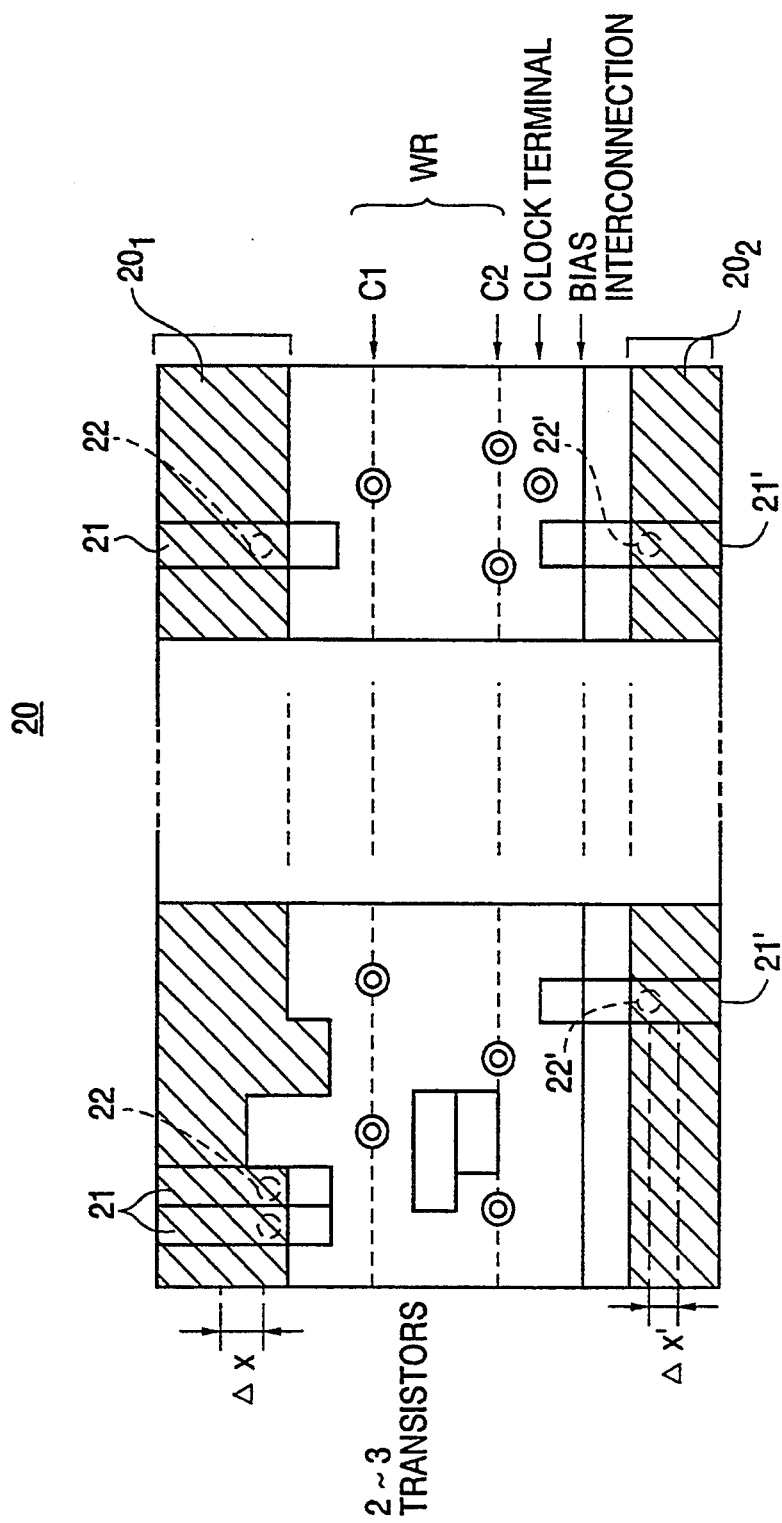
FIG. 5 is a plan view for explaining a unit block of a second embodiment of the semiconductor integrated circuit according to the present invention.

Next, a description will be given of a second embodiment of the semiconductor integrated circuit according to the present invention, by referring to FIG. 5. In FIG. 5, those parts which are the same as those corresponding parts in FIG. 4 are designated by the same reference numerals, and a description thereof will be omitted. This embodiment compensates for the voltage drop of the power source voltage which may be different between a central part and a peripheral part of the chip, for example.

This embodiment is suited for use at a position which is relatively far from a power source supplying terminal of the semiconductor chip, that is, at a position where the voltage drop of the power source voltage is relatively large. In order to compensate for the voltage drop of the power source voltage, positions of the contact holes 22 and 22' for respectively coupling the interconnections $20_1$ and $20_2$ to the diffusion regions 21 and 21' are offset by $\Delta X$ and $\Delta X'$, respectively, towards the center part of the unit block 20 in the Y direction as shown in FIG. 5.

The voltage drop of the power source voltage can easily be obtained by simulation when designing the chip using the CAD. Hence, in this embodiment, the voltage drop of the power source voltage can be compensated by simply offsetting the positions of the contact holes 22 and 22' based on the simulation result, and there is no need to redesign the power source system as in the conventional case.

Figure 6C:
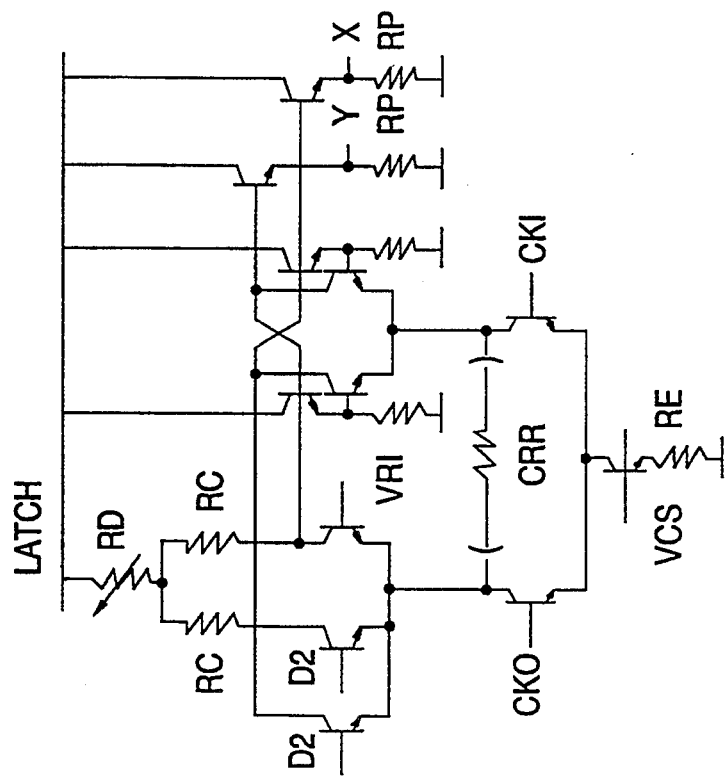
FIGS. 6A through 6C are circuit diagrams for explaining a voltage drop compensation in an ECL circuit.
Figure 6B:
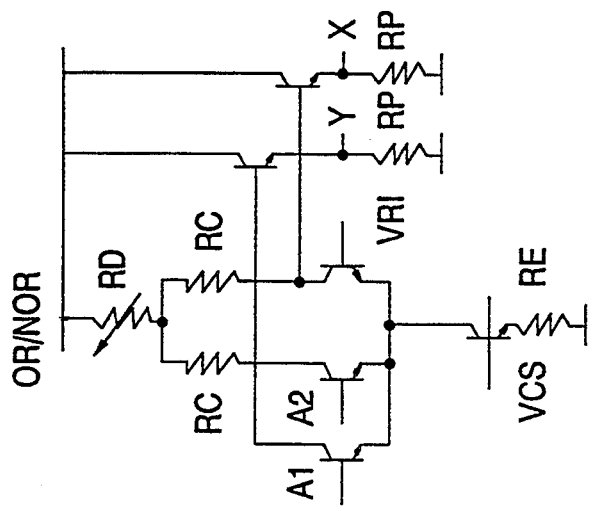
Figure 6A:
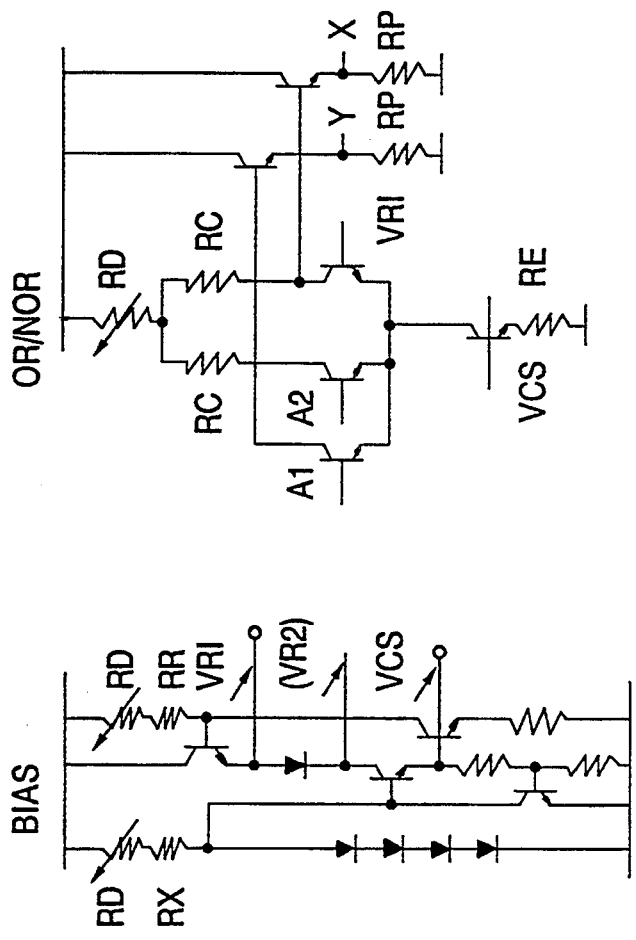

FIGS. 6A through 6C show circuit diagrams of logic circuits which correspond to the cells forming the unit block 20 shown in FIG. 5. FIG. 6A shows a bias circuit, FIG. 6B shows an OR/NOR circuit, and FIG. 6C shows a latch circuit. The circuitry themselves of the logic circuits shown in FIGS. 6A through 6C are known, and a description thereof will be omitted.

When the positions of the contact holes 22 and 22' are offset in FIG. 5, this offsetting is equivalent to varying the resistance of a resistor RD which is connected in series to the power source in each of the logic circuits shown in FIGS. 6A through 6C depending on the voltage drop.

Figure 7:
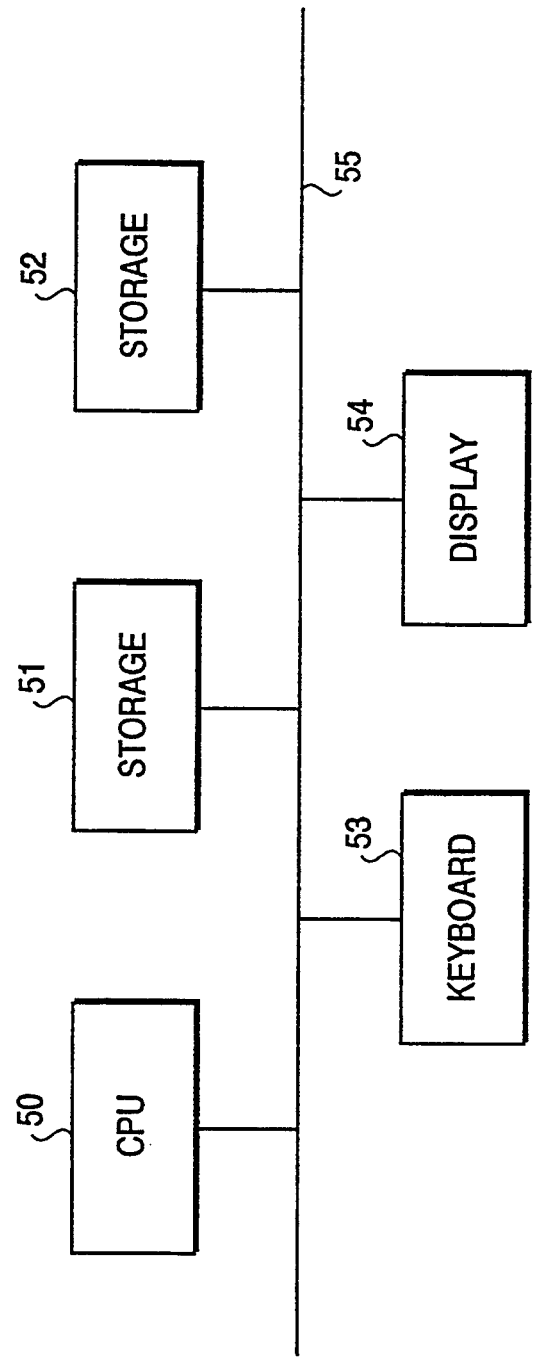
FIG. 7 is a system block diagram showing a CAD system for carrying out an embodiment of a method of designing the semiconductor integrated circuit according to the present invention.

Next, a description will be given of an embodiment of a method of designing the semiconductor integrated circuit according to the present invention. FIG. 7 shows a CAD system for carrying out this embodiment of the method, and FIG. 8 shows a flow chart for explaining an operation of the CAD system shown in FIG. 7.

The CAD system shown in FIG. 7 includes a central processing unit (CPU) 50, a first storage 51, a second storage 52, a keyboard 53 and a display 54 which are coupled via a bus 55. For example, the first storage 51 is made up of a read only memory (ROM) and stores various programs to be executed by the CPU 50, and the second storage 52 is made up of a random access memory (RAM) for storing various data.

Figure 8:
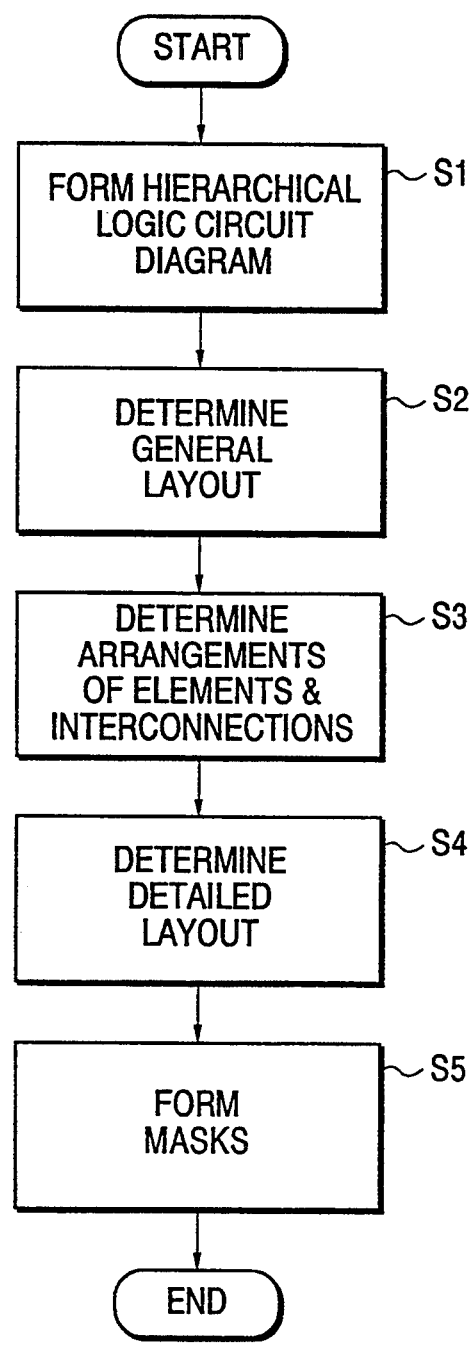
FIG. 8 is a flow chart for explaining an operation of the CAD system shown in FIG. 7.
Figure 9:
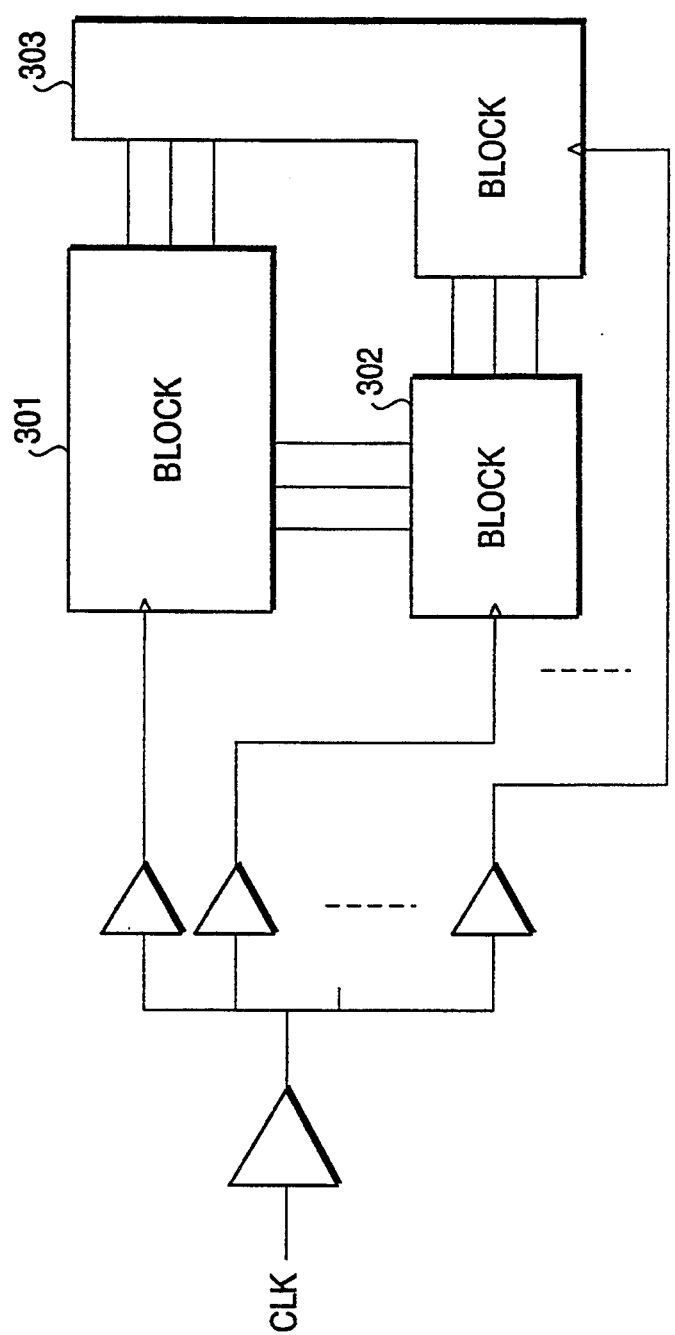
FIG. 9 shows a hierarchical logic circuit diagram.

FIG. 8 shows an operation of the CPU 50 when designing a semiconductor integrated circuit. A step S1 forms a hierarchical logic circuit diagram shown in FIG. 9, for example, and outputs a hierarchical net list. In FIG. 9, the hierarchical logic circuit generally includes hierarchical blocks 301, 302 and 303 which are connected as shown, and the hierarchical block 301 has a circuit construction shown in FIG. 10, for example.

Figure 10:
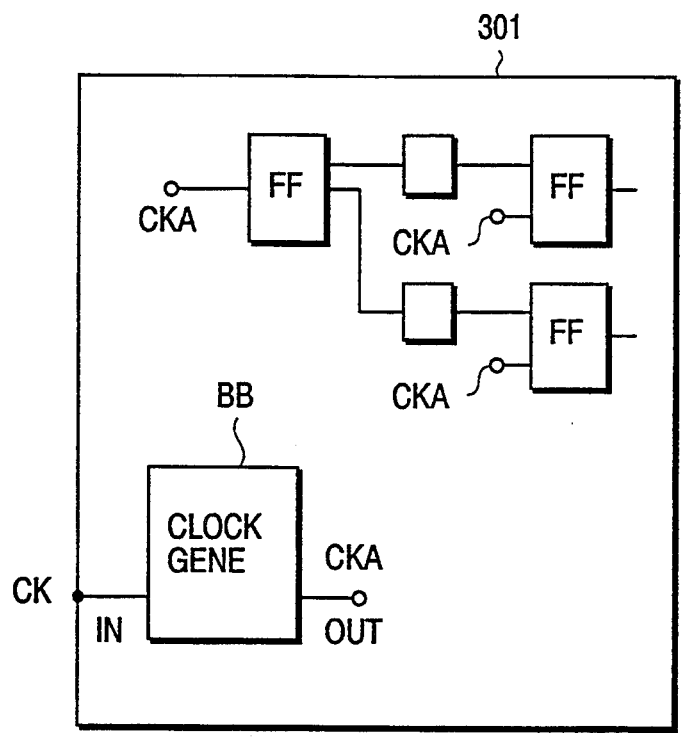
FIG. 10 shows a circuit diagram of a hierarchical block within the hierarchical logic circuit diagram shown in FIG. 9.

In FIG. 10, the hierarchical block 301 includes a plurality of flip-flops FF and a clock generator BB which receives a clock signal CK and generates a clock signal CKA which is to be supplied to each of the flip-flops FF within the hierarchical block 301. In the step S1, the output of the clock generator BB is connected to the clock terminal CKA of each of the flip-flops FF within the hierarchical block 301.

Thereafter, a step S2 determines a general (or rough) layout of the entire semiconductor integrated circuit, and a step S3 determines the arrangement of the elements and interconnections for each hierarchical block of the hierarchical logic circuit.

Figure 11:
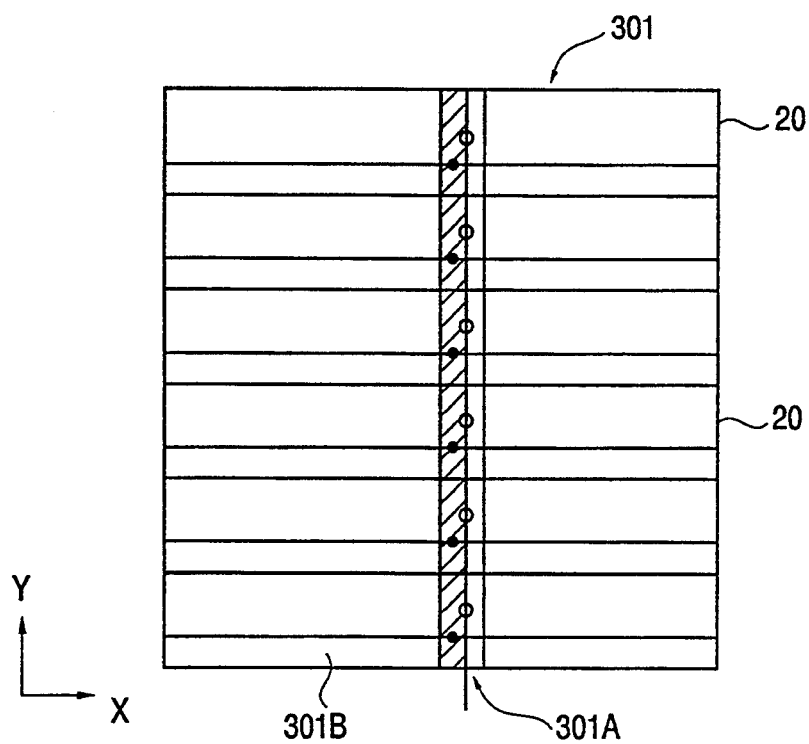
FIG. 11 is a plan view showing a layout of a clock generator within the hierarchical block shown in FIG. 10.

FIG. 11 shows a layout of the clock generator BB within the hierarchical block 391. In FIG. 11, each cell indicated by the hatchings indicate a clock driver cell of the clock generator BB. An interconnection 301A, which extends in the Y direction, is connected to input terminals of each clock driver cell, while each interconnection 301B, which extends in the X direction, is connected to an output terminal of each clock driver cell.

Next, a step S4 determines a detailed layout of the entire semiconductor integrated circuit using the data stored in the memory 52 (shown in FIG. 7) such as cell skeletons, and a step S5 forms masks using the data stored in the memory 52 such as cell-mask patterns.

Figure 12:
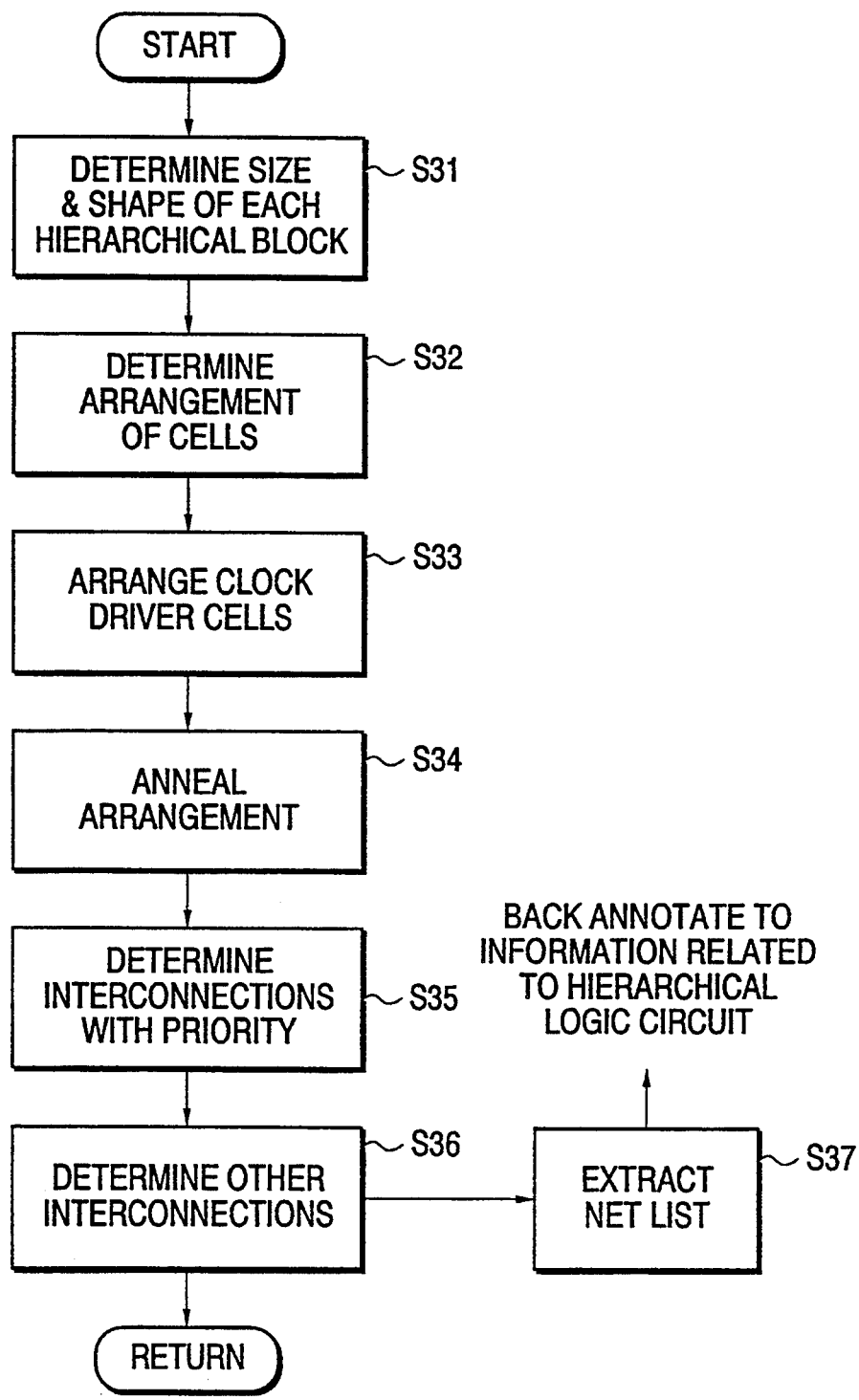
FIG. 12 is a flow chart for explaining an essential part of the operation shown in FIG. 8.

FIG. 12 shows the step S3 shown in FIG. 8 in more detail. In FIG. 12, a step S31 determines the size and shape of each hierarchical block, and determines a combination N×M of the unit blocks 20. A step S32 determines the arrangement of the cells. In the case of the hierarchical block 301, for example, the flip-flops FF are concentrated as much as possible within one unit block 20. A step S33 automatically arranges the clock driver cells within each unit block which includes the flip-flops FF. Then, a step S34 anneals the arrangement, and a step S35 determines the interconnections of the clock system, for example, with priority over other interconnections. The interconnections of the clock system is easy to generate on the CAD because the related terminals are arranged in line along the X or Y direction. In other words, in the case of the semiconductor integrated circuit shown in FIG. 4, for example, a grid on which the clock terminals CL are arranged is different from grids on which the terminals 23 are arranged. Thereafter, a step S36 determines the other interconnections. The process returns to the step S4 shown in FIG. 8 after the step S36, but at the same time, a step S37 extracts the net list of the clock system. The extracted net list is back annotated to the information related to the hierarchical logic circuit.

When determining the other interconnections in the step S36, it is possible to freely use the interconnection region WR which extends linearly within the unit block 20 in the direction X as shown in FIGS. 4 and 5 described above. For this reason, the CAD system can generate interconnections which use the interconnection region WR with a high degree of efficiency.

On the other hand, since the height positions of the terminals in the Y direction are aligned for each of the cells within the unit block 20, the interconnections for supplying the bias voltage, the clock signal and the like in common to each of the cells within the unit block 20 can be formed as a fixed pattern or an exclusive pattern in the step S35. Further, the offsetting of the contact holes 22 and 22' may also be made in the step S35 depending on the voltage drop to be compensated at each position within the unit block.

Therefore, it is possible to realize a semiconductor integrated circuit (chip) which has a high performance, that is, which enables a stable operation and has a uniform clock skew and the like.

In the embodiments described above, the terminals which are arranged in the X or Y directions outside the interconnection region WR are designed to receive a clock signal. However, these terminals may be designed to receive a reset signal, a selector input signal, an ON/-OFF signal for controlling a power save mode of the semiconductor integrated circuit, a tri-state control signal, a bus control signal, a test signal and the like.

Further, the present invention is not limited to these embodiments, but various variations and modifications may be made without departing from the scope of the present invention.

What is claimed is:

1. A semiconductor integrated circuit comprising:
   a substrate having a predetermined width in a first direction and a predetermined length in a second direction which is approximately perpendicular to the first direction; and
   a plurality of cells provided on said substrate, said plurality of cells being grouped as groups of cells into respective generally rectangular unit blocks, cells of each unit block being arranged adjacent to each other in the first direction and having mutually different widths in the first direction from other cells in the same unit block but a common length in the second direction, wherein each unit block comprises:
   first interconnections for supplying a power source voltage in common to each of the cells within said each unit block;
   a row of first input/output terminals of the cells within said each unit block, linearly arranged in the first direction;
   a row of second input/output terminals of the cells within said each unit block, linearly arranged in the first direction;
   an interconnection region at least including a region which is defined by the rows of the first and second terminals; and
   second interconnections located within said interconnection region connecting various ones of the first and second input/output terminals of the cells within said each unit block.

2. The semiconductor integrated circuit as claimed in claim 1, wherein said first interconnections respectively extend generally in the first direction within said each unit block.

3. The semiconductor integrated circuit as claimed in claim 2, each unit block further comprises:
a plurality of resistor regions formed in said each unit block and connected to said first interconnections via contact holes, for supplying driving currents to respective cells within said each unit block, the position of each contact hole being set so that a predetermined voltage is supplied to a corresponding one of said cells of said each unit block.

4. The semiconductor integrated circuit as claimed in claim 3, wherein the positions of said contact holes are offset in the second direction depending on an amount of voltage drop to be compensated at each position of said each unit block.

5. The semiconductor integrated circuit as claimed in claim 4, wherein each unit block further comprises:
a row of third terminals of the cells within said each unit block, linearly arranged in the first direction outside said interconnection region, said third terminals transferring a signal selected from a group consisting of a clock signal, a reset signal, a selector input signal, a ON/OFF signal for controlling a power save mode of the semiconductor integrated circuit, a tri-state control signal, a bus control signal and a test signal to ones of the cells within said each unit block.

6. The semiconductor integrated circuit as claimed in claim 1, wherein each unit block further comprises a row of third terminals of the cells within said each unit block, linearly arranged in the first direction outside said interconnection region, said third terminals transferring a signal selected from a group consisting of a clock signal, a reset signal, a selector input signal, a ON/OFF signal for controlling a power save mode of the semiconductor integrated circuit, a tri-state control signal, a bus control signal and a test signal to ones of the cells within said each unit block.

7. The semiconductor integrated circuit as claimed in claim 6, wherein each unit block further comprises a third interconnection for connecting the third terminals of said each unit block.

8. The semiconductor integrated circuit as claimed in claim 7, wherein said first and third interconnections are fixed relative to said second interconnections for said each unit block.

9. The semiconductor integrated circuit as claimed in claim 1, wherein said first interconnections are provided in common for specific unit blocks which form a macro block so as to supply the power source voltage in common to each of the cells within the specific unit blocks within the macro block.

10. A computer-implemented method of designing a semiconductor integrated circuit said computer-implemented method comprising the steps of:
(a) forming a hierarchical logic circuit diagram;
(b) determining a general layout of the entire semiconductor integrated circuit, wherein the general layout of the semiconductor integrated circuit is such that the semiconductor circuit to be made comprises a substrate having a predetermined width in a first direction and a predetermined length in a second direction which is approximately perpendicular to the first direction, and a plurality of cells provided on said substrate, said plurality of cells being grouped as groups of cells into respective generally rectangular unit blocks, cells of each unit block being arranged adjacent to each other in the first direction and having mutually different widths in the first direction from other cells in the same unit block but a common length in the second direction, wherein each unit block comprises first interconnections for supplying a power source voltage in common to each of the cells within said each unit block a row of first input/output terminals of the cells within said each unit block, linearly arranged in the first direction, a row of second input/output terminals of the cells within said each unit block, linearly arranged in the first direction, an interconnection region at least including a region which is defined by the rows of the first and second terminals, and second interconnections located within said interconnection region connecting various ones of the first and second terminals of the cells within said each unit block;
(c) determining an arrangement of elements and interconnections for each hierarchical block of the hierarchical logic circuit;
(d) determining a detailed layout of the entire semiconductor integrated circuit; and
(e) forming masks in accordance with the detailed layout,
said step (c) determining, for each hierarchical block, at least a combination of the unit blocks, and arranging a row of third terminals of the cells within said each unit block in the first direction outside the interconnection region, said third terminals to be used for transferring a signal selected from a group consisting of a clock signal, a reset signal, a selector input signal, a ON/OFF signal for controlling a power save made of the semiconductor integrated circuit, a tri-state control signal, a bus control signal and a test signal to ones of the cells within said each unit block.

11. The computer-implemented method as claimed in claim 10, wherein said step (c) determines a third interconnection for connecting the third terminals within said each unit block with priority over the first and second interconnections.

12. The computer-implemented method as claimed in claim 10, wherein said step (c) determines the size and shape of each hierarchical block when determining the combination of the unit blocks.

13. The computer-implemented method as claimed in claim 10, wherein said step (c) automatically arranges linearly the third terminals of the cells within said each unit block in the first direction and outside the interconnection region.

14. The computer-implemented method as claimed in claim 10, wherein said step (c) further comprises the steps of:
extracting a net list related to the third terminals; and back annotating the extracted net list to information related to the hierarchical logic circuit.

15. The computer-implemented method as claimed in claim 10, wherein said step (c) further comprises defining a plurality of resistor regions to be formed in said each unit block and to be connected to the first interconnections via contact holes, for supplying driving currents to respective cells within said each unit block, the position of each contact hole being set so that a predetermined voltage is supplied to a corresponding one of the cells of said each unit block.

16. The computer-implemented method as claimed in claim 15, wherein said step (c) offsets the contact holes in the second direction depending on a voltage drop to be compensated at each position within said each unit block.

17. A semiconductor integrated circuit comprising:
   a substrate having a predetermined width in a first direction and a predetermined length in a second direction which is approximately perpendicular to the first direction; and
   a plurality of cells provided on said substrate, said plurality of cells being grouped into generally rectangular unit blocks, cells of each group of cells being arranged adjacent to each other in the first direction and having mutually different widths in the first direction from other cells in the same unit block cells but a common length in the second direction, wherein each unit block comprises:
   first interconnections for supplying a power source voltage in common to each of the cells within said each unit block;
   a row of first input/output terminals of the cells within said each unit block, linearly arranged in the first direction;
   a row of second input/output terminals of the cells within said each unit block, linearly arranged in the first direction;
   an interconnection region including at least a region which bounded in the second direction by the rows of the first and second terminals and bounded in the first direction by each opposite side of said each unit block which is parallel to the second direction; and
   second interconnections located within said interconnection region connecting various ones of the first and second input/output terminals of the cells within said each unit block.

* * * * *

UNITED STATES PATENT AND TRADEMARK OFFICE
CERTIFICATE OF CORRECTION

PATENT NO. : 5,388,055
DATED : February 7, 1995
INVENTOR(S) : Tetsu TANIZAWA et al.

It is certified that error appears in the above-indentified patent and that said Letters Patent is hereby corrected as shown below:

Column 1, line 15, change "LSI," to --LSIs,--;

Column 7, line 33, change "391" to --301--.

Signed and Sealed this

Sixteenth Day of May, 1995

Attest:

BRUCE LEHMAN

Attesting Officer     Commissioner of Patents and Trademarks